(12) United States Patent
Chou et al.

(10) Patent No.: US 7,022,610 B2
(45) Date of Patent: Apr. 4, 2006

(54) WET CLEANING METHOD TO ELIMINATE COPPER CORROSION

(75) Inventors: Chun-Li Chou, Shinjhuang (TW); Yih-Ann Lin, Taipei (TW); Yi-Chen Huang, Hsin-Chu (TW); Chao-Cheng Chen, Chong-Lin (TW); Hun-Jan Tao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 47 days.

(21) Appl. No.: 10/743,979

(22) Filed: Dec. 22, 2003

(65) Prior Publication Data

US 2005/0136678 A1   Jun. 23, 2005

(51) Int. Cl.
*H01L 21/302* (2006.01)

(52) U.S. Cl. .................. 438/704; 134/1.2; 134/1.3; 438/725; 438/748; 438/750

(58) Field of Classification Search ............... 134/1.2, 134/1.3; 216/57, 92; 438/704, 725, 734, 438/748, 750
See application file for complete search history.

(56) References Cited

U.S. PATENT DOCUMENTS

| | | | |
|---|---|---|---|
| 6,273,108 B1 * | 8/2001 | Bergman et al. | 134/102.1 |
| 6,468,907 B1 * | 10/2002 | Pyo | 438/687 |
| 6,513,537 B1 * | 2/2003 | Orii et al. | 134/1.2 |
| 6,758,938 B1 * | 7/2004 | Torek et al. | 156/345.11 |
| 6,797,627 B1 * | 9/2004 | Shih et al. | 438/694 |
| 6,797,648 B1 * | 9/2004 | Aoki et al. | 438/782 |
| 6,864,187 B1 * | 3/2005 | Tominori et al. | 438/745 |

FOREIGN PATENT DOCUMENTS

JP   09-146079   * 9/2002

* cited by examiner

Primary Examiner—George A. Goudreau
(74) Attorney, Agent, or Firm—Duane Morris LLP

(57) ABSTRACT

A method for cleaning semiconductor substrates includes a DI water clean operation that uses a spin speed no greater than 350 rpm. The cleaning method may include additional cleaning operations such as an organic clean, an aqueous chemical clean or a DI water/ozone clean. The cleaning method may be used to clean substrates after the conclusion of an etching procedure which exposes a single film between a Cu-containing conductive material and the environment. The spin speed of the DI water clean operation prevents copper corrosion due to breakdown of the film that separates the Cu-containing conductive material from the environment.

21 Claims, 1 Drawing Sheet

WET CLEANING METHOD TO ELIMINATE COPPER CORROSION

FIELD OF THE INVENTION

The present invention relates, most generally, to the manufacture of semiconductor devices. More particularly, the present invention relates to a semiconductor substrate cleaning method that prevents copper corrosion.

BACKGROUND

Copper is favored as a conductive material used in interconnect features in advanced, high-speed semiconductor devices. Damascene and dual damascene interconnect technology is advantageously used to provide planarized interconnect structures in advanced semiconductor manufacturing technologies. In processing operations used to form damascene, dual damascene and other openings, a dielectric layer is etched to expose a protective layer or etch stop layer. The exposed layer may be disposed directly between a subjacent copper-containing conductive material and the environment. A shortcoming of the use of copper is that copper is susceptible to corrosion when exposed to the environment.

Dielectric etching operations use a photoresist film as an etch mask. After the conclusion of the etching operation used to form the damascene, dual damascene or other openings in the dielectric layer, a sequence of cleaning operations is used to remove the photoresist film and other undesired by-products and contaminants generated during the etching operation, and to clean and dry the semiconductor substrate. The phenomenon of copper corrosion could result during these cleaning operations or subsequent to the cleaning operations as a result of the condition of the substrate.

According to conventional processing methods, the post-etch cleaning operation typically includes a DI water cleaning step in which the semiconductor substrate is rotated at a relatively high spin speed, such as 500–1000 rpm. It has been found that the DI water cleaning step introduces a high potential gradient across the semiconductor substrate due to electrostatic charge build-up produced by friction between the semiconductor substrate surface and the DI water. This potential gradient induces breakdown of dielectric materials such as etch stop layers or other protective layers which separate a copper containing conductive material disposed beneath such layer, from the environment after the layer is exposed during the dielectric etching operation. The breakdown of such a layer exposes copper and leads to copper corrosion. The potential gradient also creates a battery circuit that, through galvanic effect, also causes copper corrosion. Copper corrosion causes device failure or at least device functionality problems.

It would therefore be desirable to provide a post-etch semiconductor substrate cleaning operation that effectively cleans the semiconductor substrate and does not cause copper corrosion.

SUMMARY OF THE INVENTION

To address the aforementioned shortcomings of conventional technology and in view of its purposes, the present invention provides a method for effectively cleaning semiconductor substrates that are susceptible to copper corrosion, while maintaining the integrity of the copper features and preventing copper corrosion.

In one embodiment, the present invention provides a method for reducing copper corrosion in a semiconductor device. The method includes providing a semiconductor substrate that has a copper-containing conductive material and a film directly interposed between the copper containing conductive material and the environment. The method further provides cleaning the semiconductor substrate including using a DI water clean operation that includes rotating the semiconductor substrate at a spin speed no greater than 350 rpm.

The method of the present invention may be used in various semiconductor substrate cleaning operations including after the dielectric etching operations used to form damascene or dual damascene openings.

BRIEF DESCRIPTION OF THE DRAWINGS

The present invention is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawings. Included are the following figures.

DETAILED DESCRIPTION

The present invention provides a semiconductor substrate cleaning method that prevents copper corrosion. The cleaning method includes a DI (deionized) water cleaning operation in which the semiconductor substrate, alternatively referred to as a "wafer", is rotated at a speed of no greater than 350 rpm. As will be discussed, the cleaning method of the present invention may include multiple distinct cleaning operations or steps.

Figure 1:
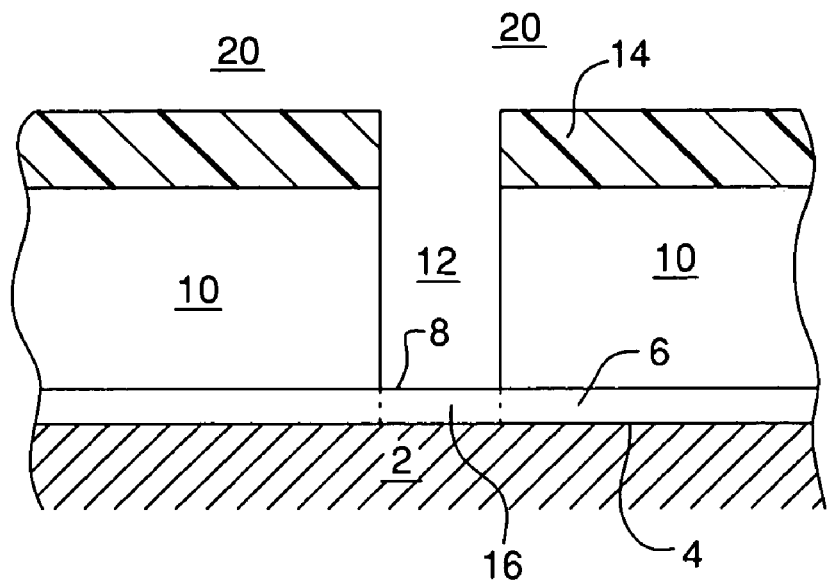
FIG. 1 is a cross sectional view showing an exemplary etched structure according to the PRIOR ART and which may be cleaned according to the method of the present invention.
Figure 2:
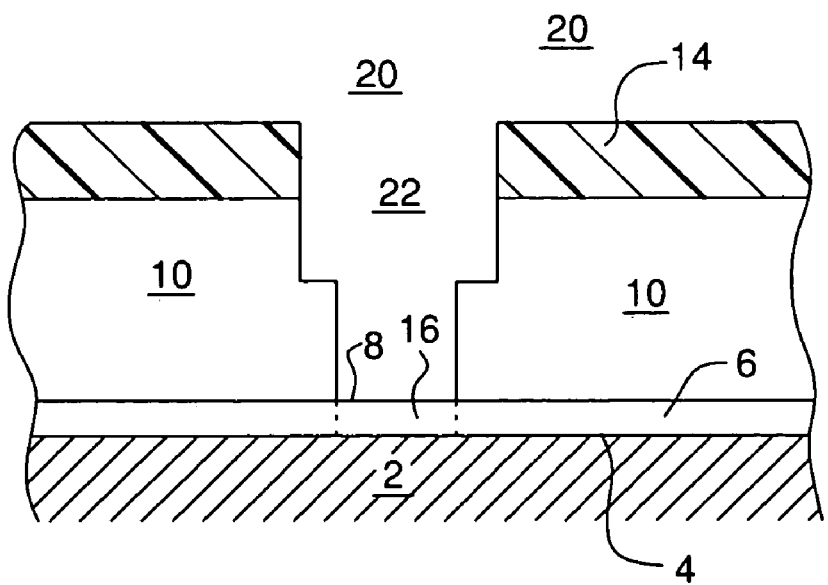
FIG. 2 is a cross sectional view showing another exemplary etched structure according to the PRIOR ART and which may be cleaned according to the method of the present invention

The wafer cleaning method of the present invention may be used at various stages during the formation of semiconductor devices on the wafer. A particularly advantageous application of the present invention is a cleaning operation used to clean a wafer with a copper-containing conductive material formed thereon and a film directly interposed between the copper containing conductive material and the environment. Such a structure may be produced after an etching operation. FIGS. 1 and 2 are each cross-sectional views of exemplary conventional structures used to produce semiconductor devices and which find particular advantage in being cleaned by the method of the present invention. In FIGS. 1 and 2, Cu-containing conductive material 2 is formed over a semiconductor substrate (not shown). Cu-containing conductive material 2 may be a copper film used as an interconnect wire and it may be substantially pure copper in an exemplary embodiment, but other Cu-containing conductive materials such as copper alloys, may be used in other exemplary embodiments. Film 6 is formed over surface 4 of Cu-containing conductive material 2 and is directly interposed between Cu-containing conductive material 2 and the environment 20 in locations where film 6 is not covered by dielectric layer 10. As such, exposed portion 16 of film 6 is particularly sensitive to breakdown due to potential issues discussed above and the breakdown of portion 16 of film 6 exposes portions of Cu-containing conductive material 2 to environment 20 and leads to copper corrosion. In FIG. 1 opening 12 is formed in dielectric layer 10 to expose surface 8 of film 6. In FIG. 2, two-tiered opening 22 is formed in dielectric layer 10 and exposes surface 8 of film 6.

FIGS. 1 and 2 may each represent structures following an etching operation in which photoresist mask 14 was used to mask dielectric layer 10 and form the respective opening. In this manner, film 6 may serve as an etch-stop layer. Film 6 may be formed of materials such as SiN, SiC, SiOC, SiCN or various other suitable films used as etch-stop layers or layers otherwise used to separate or protect a Cu-containing conductive material from the environment. Film 6 may include a thickness within the range of 400–800 angstroms, but other thicknesses may be used in other exemplary embodiments.

In an exemplary embodiment, the cleaning method of the present invention may be used after one or more of the etch processes in the process sequence used to form a damascene or dual damascene opening in the dielectric film. FIG. 1 shows an exemplary damascene opening 12 and FIG. 2 shows an exemplary dual damascene opening 22. FIG. 1 may alternatively represent the first (via etch) step in the process sequence used to form the dual damascene opening 22 shown in FIG. 2 and which may be formed after a subsequent trench etching operation. Various dielectric materials may be used as dielectric layer 10 and dielectric layer 10 may represent a single film or a plurality of dielectric films. In one exemplary embodiment, dielectric layer 10 may be a low-k dielectric material. In one exemplary embodiment, dielectric layer 10 may include at least one layer of carbon-containing material. In another exemplary embodiment, dielectric layer 10 may include at least one layer of fluorine-containing material and in yet another exemplary embodiment, dielectric layer 10 may include at least one layer of nitrogen-containing material. Other dielectric materials may be used in other exemplary embodiments. Various suitable photoresist materials may be used as photoresist 14. Various etching processes and etchant species may be chosen and used to appropriately etch the materials used as dielectric layer 10.

In an exemplary embodiment, the wet cleaning operation of the present invention may be preceded by any of various suitable dry plasma ashing operations directed at removing photoresist 14.

The cleaning method of the present invention includes a DI water cleaning operation and may include one or more wet cleaning operations prior to the DI water cleaning operation and one or more cleaning, rinsing, and/or drying operations after the DI water cleaning operation. The various sequences of wet cleaning operations may be performed in-situ and in various wet cleaning tools such as SEZ4300 manufactured by SEZ AG and various wet cleaning tools manufactured by Semitool, Inc. of Kalispell, Mont. The cleaning tool may individually rotate the semiconductor substrates, and in an exemplary embodiment, may individually process semiconductor substrates in a single-wafer processing chamber.

In one exemplary cleaning sequence of the present invention, at least one of an organic solvent clean, an aqueous chemical clean or a DI water/ozone clean may take place in-situ prior to the DI water cleaning operation. In an exemplary embodiment, the organic solvent clean may include a spin speed of 150–800 rpm and may contain fluorine. "Spin speed" is the speed at which the individual semiconductor substrate or wafer is rotated during processing. In an exemplary embodiment, the DI water/ozone clean operation may include a spin speed ranging from 150 to 350 rpm and in an exemplary embodiment the aqueous chemical clean may include a spin speed of 150–350 rpm. Such are intended to be exemplary only and various other cleaning operations with various spin speeds may be performed in-situ, along with the DI water cleaning operation of the present invention.

The DI water cleaning operation of the present invention preferably takes place at a spin speed no greater than 350 rpm. In an exemplary embodiment, the spin speed may be greater than 150 rpm and a spin speed of about 200 rpm may be used in one exemplary embodiment. In an exemplary embodiment in which a 300 millimeter wafer is used, the spin speed may range from 180 to 250 rpm and in another exemplary embodiment in which a 200 mm wafer is used, the spin speed may range from 200 to 300 rpm, but other spin speeds may be used in other exemplary embodiments. The duration of the DI water cleaning operation may vary and in one exemplary embodiment the duration of this operation may be two minutes. DI water may be delivered to the surface of the wafer using conventional means. During the DI water cleaning operation, nitrogen and/or air may be the gases of the ambient environment within the region of the tool in which the cleaning operation takes place.

The DI water cleaning operation may be followed by one or more in-situ further cleaning or rinsing operations. After the cleaning and rinsing operations are concluded, an in-situ drying operation may be used. The drying operation may include a spin speed as high as 2,000 rpm.

While the cleaning operation of the present invention was described above in conjunction with a dielectric etching process, such is exemplary only and the cleaning operation of the present invention may be used at various stages during the manufacturing process used to form semiconductor devices.

The preceding merely illustrates the principles of the invention. It will thus be appreciated that those skilled in the art will be able to devise various arrangements which, although not explicitly described or shown herein, embody the principals of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the accompanying drawings, which are to be considered part of the entire written description. In the description, relative terms such as "lower", "upper", "horizontal", "vertical", "above", "below", "up", "down", "top" and "bottom" as well as derivative thereof (e.g., "horizontally", "downwardly", "upwardly", etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for reducing copper corrosion in a semiconductor device comprising:
   providing a semiconductor substrate with a Cu-containing conductive material formed thereon and a film directly interposed between said Cu-containing conductive material and the environment; and
   cleaning said semiconductor substrate using a substantially ozone-free DI water clean operation that includes rotating said semiconductor substrate at a spin speed no greater than 350 rpm.

2. The method as in claim 1, wherein said providing includes performing an etch operation that exposes said film and includes using a patterned photoresist layer as an etch mask, and said cleaning said semiconductor substrate further comprises removing portions of said photoresist layer.

3. The method as in claim 2, wherein said cleaning said semiconductor substrate further comprises stripping said photoresist layer using a plasma prior to said using a DI water clean operation.

4. The method as in claim 1, wherein said film comprises an etch stop film and said providing comprises performing an etch operation that etches a dielectric layer formed over said etch stop film and exposes said etch stop film.

5. The method as in claim 4, wherein said etch stop film is disposed directly beneath said dielectric layer.

6. The method as in claim 4, wherein said etching a dielectric layer is part of a dual damascene dry etching process sequence.

7. The method as in claim 4, wherein said dielectric layer includes at least one of a layer of carbon-containing material, a layer of nitrogen-containing material and a layer of fluorine-containing material.

8. The method as in claim 1, wherein said Cu-containing conductive material comprises substantially pure copper.

9. The method as in claim 1, wherein said film comprises one of SiN, SiC, SiOC, and SiCN.

10. The method as in claim 1, wherein said film includes a thickness ranging from 400 to 800 angstroms.

11. The method as in claim 1, wherein said cleaning includes rotating said semiconductor substrate at a spin speed of at least 150 rpm during said DI water clean operation.

12. The method as in claim 1, wherein said semiconductor substrate is approximately 300 mm in diameter and said spin speed lies within the range of 180 to 250 rpm.

13. The method as in claim 1, wherein said semiconductor substrate is approximately 200 mm in diameter and said spin speed lies within the range of 200 to 300 rpm.

14. The method as in claim 1, wherein said cleaning further includes cleaning said semiconductor substrate using an in-situ organic cleaning operation, an aqueous chemical cleaning operation or a DI water/ozone cleaning operation, prior to said using a DI water clean operation.

15. The method as in claim 14, wherein said in-situ organic cleaning operation, aqueous chemical cleaning operation or DI water/ozone cleaning operation comprises an organic cleaning operation using an organic solvent that contains fluorine.

16. The method as in claim 1, further comprising performing an in-situ drying operation by spin drying said semiconductor substrate.

17. The method as in claim 16, wherein said spin drying includes air or nitrogen as a gaseous medium.

18. The method as in claim 1, wherein said DI water clean operation includes nitrogen or air as an ambient medium.

19. The method as in claim 1, wherein said cleaning comprises individually cleaning said semiconductor substrate in a tool that processes semiconductor substrates individually.

20. A method for reducing copper corrosion in a semiconductor device comprising:
   providing a semiconductor substrate with a Cu-containing conductive material formed thereon;
   performing an etch operation that exposes an etch stop film directly interposed between said Cu-containing conductive material and the environment; and
   cleaning said semiconductor substrate using a DI water clean operation that includes rotating said semiconductor substrate at a spin speed no greater than 350 rpm.

21. A method for reducing copper corrosion in a semiconductor device comprising:
   providing a semiconductor substrate with a Cu-containing conductive material formed thereon and a film directly interposed between said Cu-containing conductive material and the environment, wherein the film comprises one of SiN, SiC, SiOC and SiON; and
   cleaning said semiconductor substrate using a DI water clean operation that includes rotating said semiconductor substrate at a spin speed no greater than 350 rpm.

* * * * *